(12) United States Patent
Ku et al.

(10) Patent No.: US 9,645,197 B2
(45) Date of Patent: May 9, 2017

(54) METHOD OF OPERATING TESTING SYSTEM

(71) Applicant: MPI CORPORATION, Zhubei (TW)

(72) Inventors: Wei-Cheng Ku, Zhubei (TW); Shao-Wei Lu, Zhubei (TW); Hao Wei, Zhubei (TW); Yu-Tse Wang, Zhubei (TW)

(73) Assignee: MPI CORPORATION, Zhubei (TW)

( * ) Notice: Subject to any disclaimer, the term of this patent is extended or adjusted under 35 U.S.C. 154(b) by 338 days.

(21) Appl. No.: 14/557,181

(22) Filed: Dec. 1, 2014

(65) Prior Publication Data
US 2015/0204962 A1 Jul. 23, 2015

(30) Foreign Application Priority Data
Dec. 13, 2013 (TW) .............................. 102146113 A

(51) Int. Cl.
*G01R 31/00* (2006.01)
*G01R 31/28* (2006.01)
*G01R 35/00* (2006.01)

(52) U.S. Cl.
CPC ....... *G01R 31/2891* (2013.01); *G01R 35/005* (2013.01)

(58) Field of Classification Search
CPC ............ G01R 1/07307; G01R 1/07342; G01R 1/0466; G01R 1/06705; G01R 1/06794; G01R 1/07314; G01R 1/07364; G01R 31/01; G01R 31/028; G01R 31/2863; G01R 31/2889; G01R 31/2891; G01R 33/0017; G01R 35/005
See application file for complete search history.

(56) References Cited

U.S. PATENT DOCUMENTS

| 6,981,422 | B1 * | 1/2006 | Comardo | ................... | B01J 8/06 73/756 |
| 2015/0204962 | A1 * | 7/2015 | Ku | ..................... | G01R 31/2891 324/750.02 |

FOREIGN PATENT DOCUMENTS

| CN | 2351766 Y | 12/1999 |
| CN | 202230991 | 5/2012 |
| TW | 201329483 | 7/2013 |

* cited by examiner

*Primary Examiner* — Tung X Nguyen
(74) *Attorney, Agent, or Firm* — Tracy M. Heims; Apex Juris, Pllc.

(57) ABSTRACT

A method of operating a testing system is provided, wherein the testing system has a test machine and a probe module, which has a first probe set and a second probe set. One of the first probe set and the second probe set can be connected to the test machine. The method includes the following steps: connect the test machine and the first probe set; calibrate the testing system; abut the first probe set against a DUT to do electrical tests; disconnect the first probe set and the DUT; disconnect the test machine and the first probe set; connect the test machine and the second probe set; calibrate the testing system again; abut the second probe set against the DUT to do electrical tests.

11 Claims, 2 Drawing Sheets

METHOD OF OPERATING TESTING SYSTEM

BACKGROUND OF THE INVENTION

1. Technical Field

The present invention relates generally to a testing system, and more particularly to a method of operating a testing system.

2. Description of Related Art

To ensure the quality of electronic products, manufacturers commonly use a testing system to check electrical connections between each precision electronic component in different stages of the manufacturing process.

In most cases, before doing electrical tests, the probes of a testing system may have to be calibrated by using a calibration plate, which does tests and provides information of compensation (i.e., returning to zero) for the probes. However, calibration is only done while initializing the tests in such method of operating a testing system, and if it is required to replace a probe due to different demands of tests, the original information of compensation would not be applicable anymore.

BRIEF SUMMARY OF THE INVENTION

In view of the above, the primary objective of the present invention is to provide a method of operating a testing system, which provides accurate results of tests every time when a probe set is replaced.

The present invention provides a method of operating a testing system, wherein the testing system includes a test machine and a probe module, which has a first probe set and a second probe set; one of the first probe set and the second probe set can be electrically connected to the test machine. The method includes the steps of: (a) electrically connecting the test machine and the first probe set; (b) calibrating the testing system; (c) abutting the first probe set against a tested portion on a DUT to do electrical tests; (d) disconnecting the first probe set and the DUT; (e) electrically disconnecting the test machine and the first probe set; (f) electrically connecting the test machine and the second probe set; and (g) calibrating the testing system again.

With the aforementioned design of the method of operating the testing system, calibration is done immediately after every time one of the probe sets is replaced, which makes the testing system capable of providing accurate results of tests.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
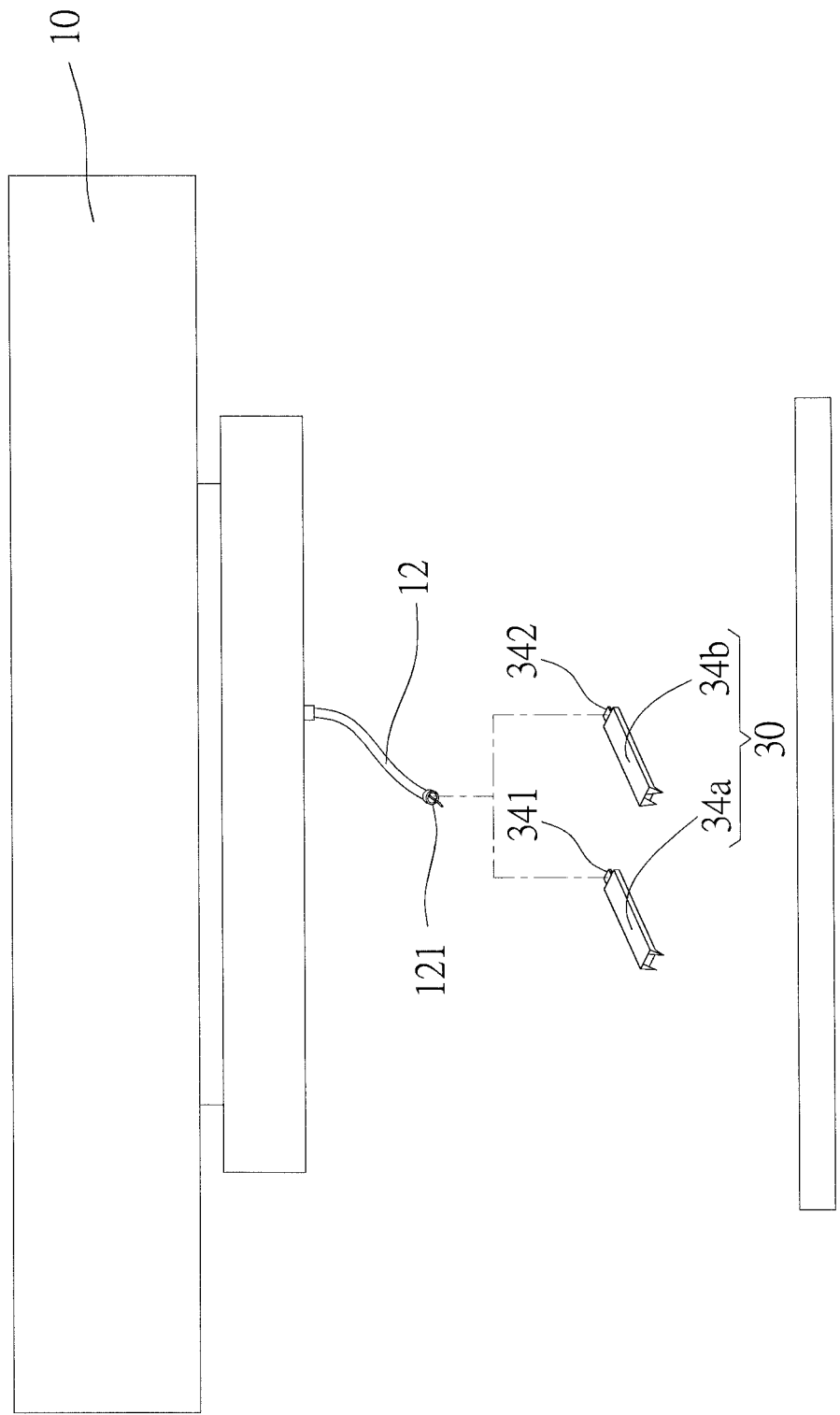
FIG. 1 is a schematic diagram of a testing system suitable for a preferred embodiment of the present invention.

As shown in FIG. 1, a testing system includes a test machine 10 and a probe module 30, wherein the test machine 10 is provided with a coaxial cable 12, which has a male connector 121 made of conductive materials at an end thereof. The probe module 30 includes a first probe set 34a and a second probe set 34b which have different measuring distances, wherein the first probe set 34a and the second probe set 34b are respectively provided with a female connector 341, 342 made of conductive materials. In this way, the male connector 121 of the cable 12 can be connected to one of the female connectors 341, 342 of the first probe set 34a or the second probe set 34b in order to satisfy different requirements of different measuring distances, which electrically connects either the first probe set 34a or the second probe set 34b to the test machine 10 through the cable 12. Of course, instead of the male and female connectors 121, 341, 342 described herein, clips or other design which can repeatedly connect and disconnect the test machine 10 and the first or the second probe sets 34a, 34b can be used in other embodiments as well.

Figure 2:
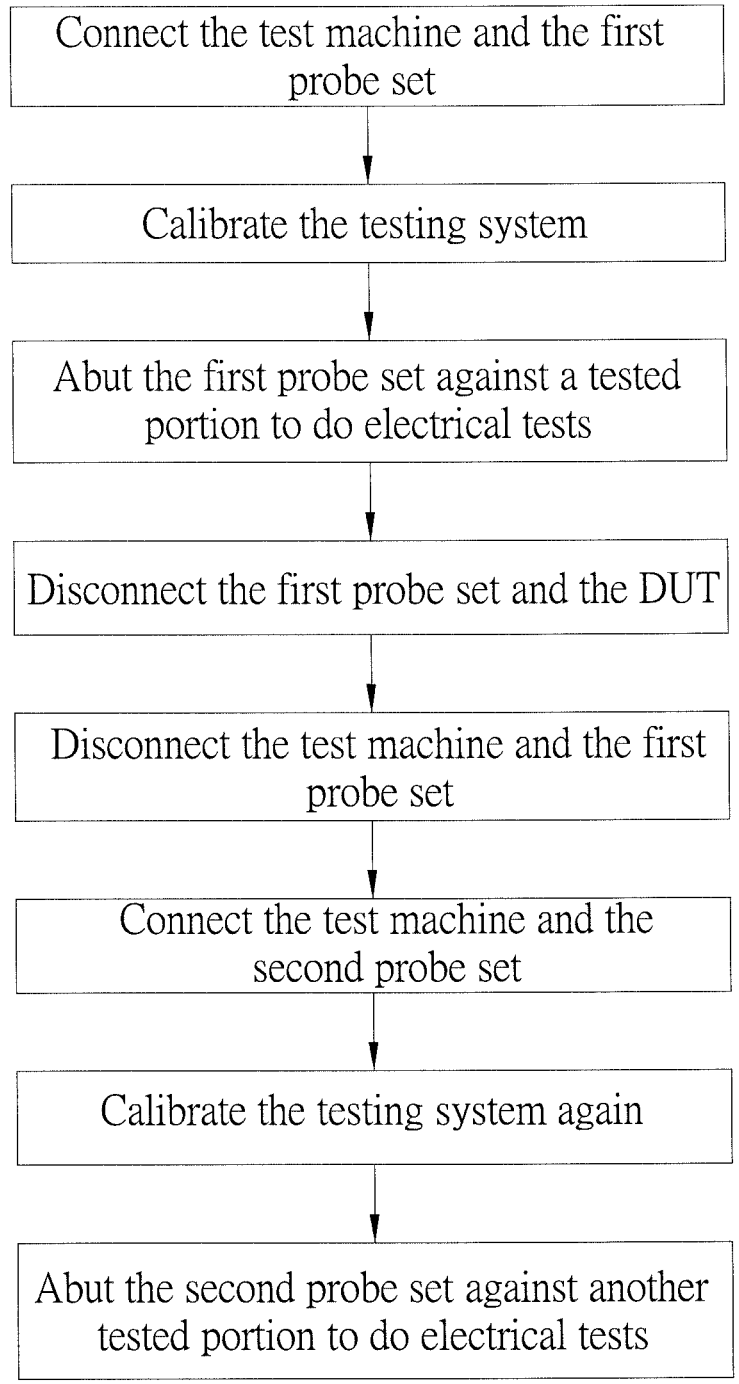
FIG. 2 is a flow chart of the preferred embodiment of the present invention.

As shown in FIG. 2, a method of operating the testing system can be applied to do electrical tests, wherein the method includes the following steps:

(a) Connect the male connector 121 of the cable 12 and the female connector 341 of the first probe set 34a to electrically connect the cable 12 and the first probe set 34a.

(b) Calibrate the testing system. In the preferred embodiment, the calibration is done by abutting tips of the first probe set 34a against a short-circuit pad, an open-circuit pad, and an impedance pad on a calibration plate (not shown) one at a time to do a short-circuit test, an open-circuit test, and an impedance test. Based on the results of these tests, the calibration on values (i.e., returning to zero, compensation on values, etc.) can be correspondingly performed, and therefore the testing system is calibrated as a result.

(c) Abut the tips of the first probe set 34a against a tested portion of a DUT. Whereby, test signals generated by the test machine 10 can be transmitted to the DUT through the cable 12 and the first probe set 34a sequentially, and then the test signals can be transmitted back to the test machine 10 through the first probe set 34a and the cable 12 sequentially too, which forms a signal loop. In this way, the test machine 10 can do electrical tests on the DUT, for the electrical properties of the tested portion can be determined to be normal or abnormal according to the returned test signals.

(d) After electrical tests on the tested portion are done, disconnect the tips of the first probe set 34a and the DUT.

(e) After that, if another tested portion of the DUT which has different measuring distance is required to be tested, disconnect the female connector 341 of the first probe set 34a and the male connector 121 of the cable 12 to separate the first probe set 34a and the cable 12.

(f) Connect the male connector 121 of the cable 12 and the second probe set 34b to electrically connect the cable 12 and the second probe set 34b.

(g) Abut tips of the second probe set 34b against a short-circuit pad, an open-circuit pad, and an impedance pad on a calibration plate (not shown) one at a time to do the short-circuit test, the open-circuit test, and the impedance test. Based on the results of these tests, the calibration on values (i.e., returning to zero, compensation on values, etc.) can be correspondingly performed. As a result, the testing system is calibrated again.

(h) After the calibration, abut the tips of the second probe set 34b against a tested portion of a DUT. Similarly, the test signals generated by the test machine 10 can be transmitted to the DUT through the cable 12 and the second probe set 34b sequentially, and then the test signals can be transmitted back to the test machine 10 through the second probe set 34b and the cable 12 sequentially as well, which forms a signal loop again. Therefore, the test machine 10 can do electrical tests on the DUT, for once again the electrical properties of the tested portion can be determined to be normal or abnormal according to the returned test signals.

With the aforementioned design, every time when either of the probe sets 34a, 34b of the testing system is replaced, calibration is performed immediately. In this way, though the electrical properties of the probe sets 34a, 34b may be different, the results of electrical tests provided by the testing system can be ensured to be still accurate.

In practice, the initial settings and status of a probe set usually, of course, comply with a standard, and therefore the process of electrical tests described in step (h) can be performed directly after step (f), i.e., directly before step (g). The process of calibration described in step (g) can be optionally skipped, and only performed when the measured yields are uninterrupted low. In addition, the method provided in the present invention is not only compatible with the testing system having two probe sets 34a, 34B, but also compatible with a testing system which has more than two probe sets. The embodiment described above is only a preferred embodiment of the present invention. All equivalent methods which employ the concepts disclosed in this specification and the appended claims should fall within the scope of the present invention.

What is claimed is:

1. A method of operating a testing system, wherein the testing system includes a test machine and a probe module, which has a first probe set and a second probe set; one of the first probe set and the second probe set can be electrically connected to the test machine; the method comprising the steps of:
    (a) electrically connecting the test machine and the first probe set;
    (b) calibrating the testing system;
    (c) abutting the first probe set against a tested portion on a DUT to do electrical tests;
    (d) disconnecting the first probe set and the DUT;
    (e) electrically disconnecting the test machine and the first probe set;
    (f) electrically connecting the test machine and the second probe set; and
    (g) calibrating the testing system again.

2. The method of claim 1, wherein the test machine is provided with a cable; in step (a), the test machine and the first probe set are electrically connected to each other by connecting the cable and the first probe set; in step (e), the test machine and the first probe set are electrically connected to each other by disconnect the cable and the first probe set.

3. The method of claim 2, wherein the cable has a male connector at an end thereof, while the first probe set has a corresponding female connector; in step (a), the cable and the first probe set are connected by connecting the male connector and the female connector; in step (e), the cable and the first probe set are disconnected by disconnecting the male connector and the female connector.

4. The method of claim 1, wherein the testing system is calibrated in step (b) by abutting the first probe set against a calibration plate to do at least one test among a short-circuit test, an open-circuit test, and an impedance test, wherein a compensation on values is performed based on result of the tests to calibrate the testing system.

5. The method of claim 1, wherein the test machine is provided with a cable; in step (f), the test machine and the second probe set are electrically connected to each other by connecting the cable and the second probe set.

6. The method of claim 5, wherein the cable has a male connector at an end thereof, while the second probe set has a corresponding female connector; in step (f), the cable and the second probe set are connected by connecting the male connector and the female connector.

7. The method of claim 1, wherein the testing system is calibrated in step (g) by abutting the second probe set against a calibration plate to do at least test among of a short-circuit test, an open-circuit test, and an impedance test, wherein a compensation on values is performed based on result of the tests to calibrate the testing system.

8. The method of claim 1, further comprising the step of:
    (h) abutting the second probe set against a tested portion on the DUT to do electrical tests thereon;
    wherein step (g) is followed by step (h).

9. The method of claim 1, further comprising the step of:
    (h) abutting the second probe set against a tested portion on the DUT to do electrical tests thereon;
    wherein step (f) is followed by step (h), which is followed by step (g).

10. The method of claim 8, wherein the first probe set and the second probe set are compatible with different measuring distances; the tested portions tested in step (c) and step (h) are two different tested portions on the DUT.

11. The method of claim 9, wherein the first probe set and the second probe set are compatible with different measuring distances; the tested portions tested in step (c) and step (h) are two different tested portions on the DUT.

* * * * *